United States Patent
Gregerson et al.

(10) Patent No.: US 9,520,310 B2
(45) Date of Patent: Dec. 13, 2016

(54) WAFER CONTAINER WITH DOOR INTERFACE SEAL

(71) Applicant: ENTEGRIS, INC., Billerica, MA (US)

(72) Inventors: Barry Gregerson, Deephaven, MN (US); Matthew A. Fuller, Colorado Springs, CO (US)

(73) Assignee: Entegris, Inc., Billerica, MA (US)

( * ) Notice: Subject to any disclaimer, the term of this patent is extended or adjusted under 35 U.S.C. 154(b) by 0 days.

(21) Appl. No.: 14/398,958

(22) PCT Filed: May 6, 2013

(86) PCT No.: PCT/US2013/039768
§ 371 (c)(1),
(2) Date: Nov. 4, 2014

(87) PCT Pub. No.: WO2013/166514
PCT Pub. Date: Nov. 7, 2013

(65) Prior Publication Data
US 2015/0122699 A1 May 7, 2015

Related U.S. Application Data

(60) Provisional application No. 61/642,922, filed on May 4, 2012.

(51) Int. Cl.
*H01L 21/673* (2006.01)
*B65D 85/30* (2006.01)
*F16J 15/10* (2006.01)

(52) U.S. Cl.
CPC ......... *H01L 21/67376* (2013.01); *B65D 85/30* (2013.01); *F16J 15/104* (2013.01)

(58) Field of Classification Search
CPC .......................... H01L 21/67376; B65D 53/02
USPC ........ 206/710, 711, 454, 455, 832; 220/378; 277/628, 647, 641, 644
See application file for complete search history.

(56) References Cited

U.S. PATENT DOCUMENTS

| | | | |
|---|---|---|---|
| 4,248,346 A | 2/1981 | Johnson | |
| 5,273,159 A | 12/1993 | Gregerson | |
| 5,586,658 A | 12/1996 | Nyseth | |
| 5,611,452 A | 3/1997 | Bonora et al. | |
| 6,354,601 B1 * | 3/2002 | Krampotich | H01L 21/67376 206/710 |
| 6,622,883 B1 | 9/2003 | Wu et al. | |

(Continued)

FOREIGN PATENT DOCUMENTS

| | | |
|---|---|---|
| JP | 2005-225545 A | 8/2005 |
| JP | 2007-308161 A | 11/2007 |

(Continued)

*Primary Examiner* — Chun Cheung

(57) ABSTRACT

A wafer container may be a front opening wafer container comprising a container portion and a door, one of the container portion and the door having a radially installed seal with a plurality of opposing lateral projections that deflect from a normal position in a direction away from an install direction when the seal is installed in a groove, the lateral projections resisting removal of the seal after the seal is seated in the groove. A core portion and a cantilevered finger member engages the other of the door and container portion when the door is seated in the container portion. Other lateral projections on the seal effectively seal the path between the seal and groove surfaces.

15 Claims, 4 Drawing Sheets

(56) References Cited

U.S. PATENT DOCUMENTS

| | | | |
|---|---|---|---|
| 6,644,477 | B2 | 11/2003 | Bores et al. |
| 6,848,578 | B2 | 2/2005 | Eggum |
| 7,029,013 | B2 | 4/2006 | Yajima et al. |
| 7,413,099 | B2 | 8/2008 | Takahashi et al. |
| 7,578,407 | B2 * | 8/2009 | Tieben ............... H01L 21/67376 220/326 |
| 8,292,081 | B2 * | 10/2012 | Sasaki ............... H01L 21/67376 206/710 |
| 8,720,693 | B2 * | 5/2014 | Nagashima ....... H01L 21/67376 206/454 |
| 2002/0195455 | A1 | 12/2002 | Takahashi et al. |
| 2005/0230284 | A1 | 10/2005 | Tieben et al. |
| 2006/0249512 | A1 * | 11/2006 | Ueda ................ H01L 21/67376 220/378 |
| 2007/0256366 | A1 | 11/2007 | Kwasnik et al. |
| 2010/0147846 | A1 | 6/2010 | Soibel et al. |

FOREIGN PATENT DOCUMENTS

| | | |
|---|---|---|
| JP | 2008-062979 A | 3/2008 |
| JP | 2010-129765 A | 6/2010 |
| KR | 20-0344371 Y1 | 3/2004 |
| KR | 10-2007-0011518 A | 1/2007 |
| KR | 10-2009-0111057 A | 10/2009 |
| WO | WO 2012-054644 A2 | 4/2012 |

* cited by examiner

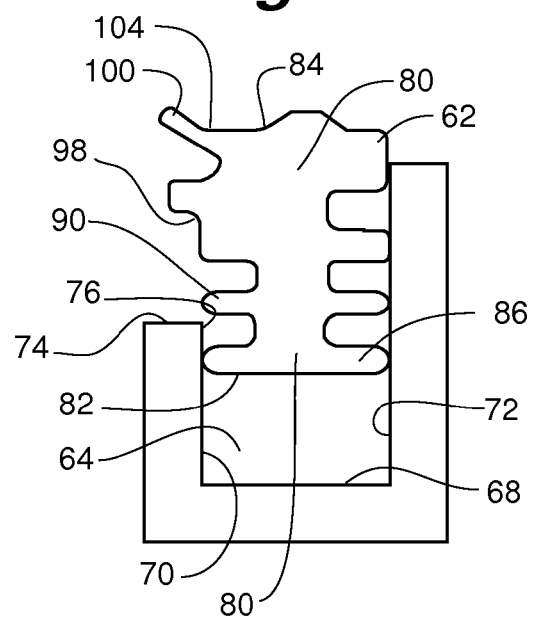
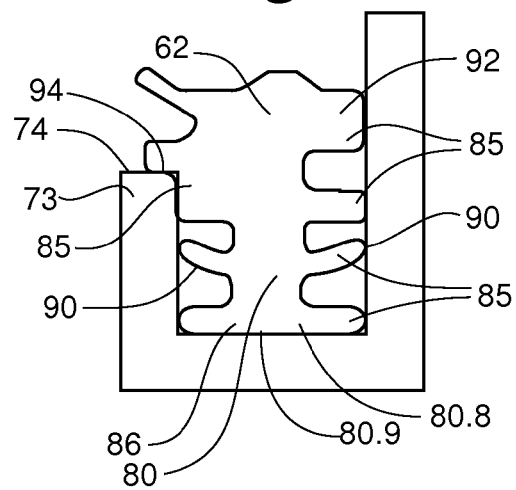
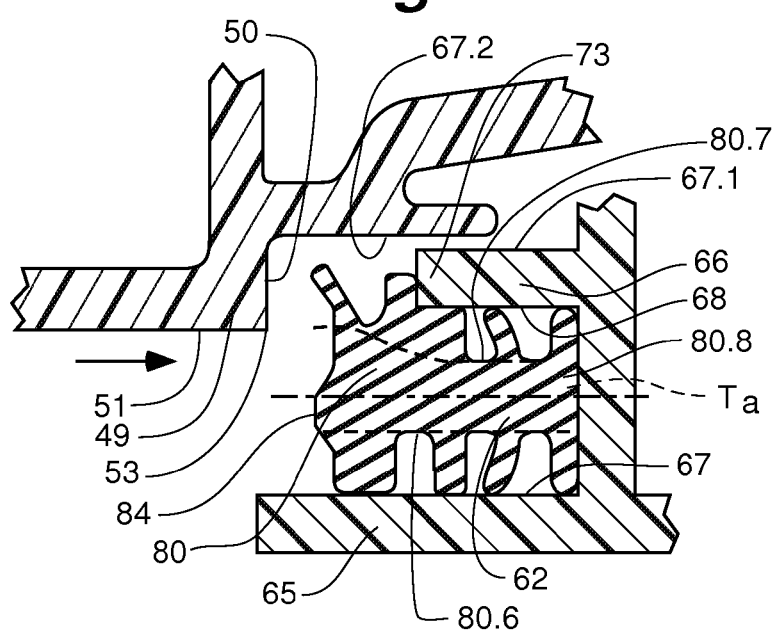

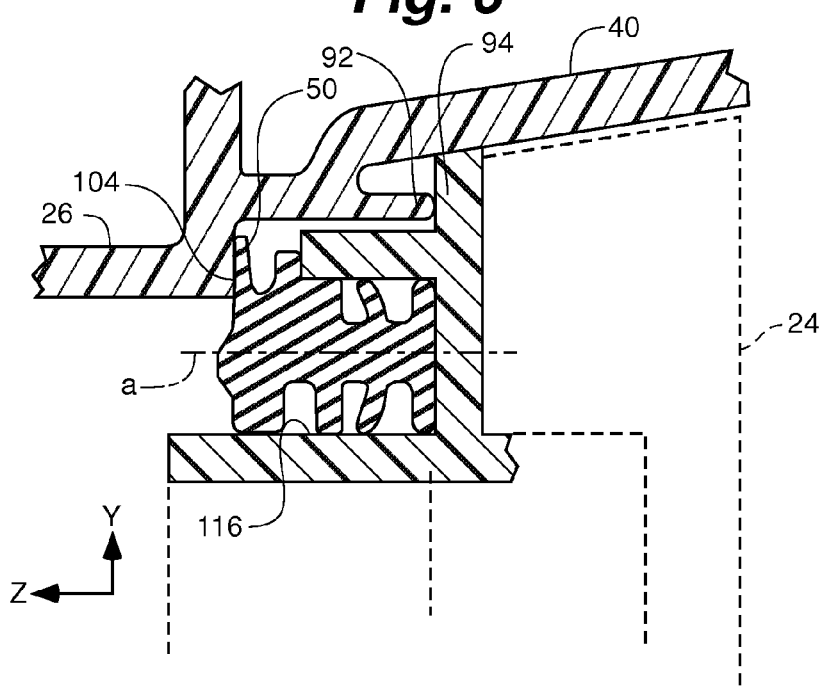
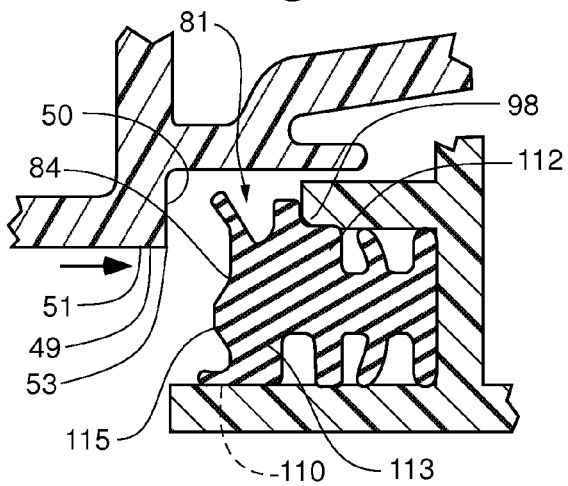
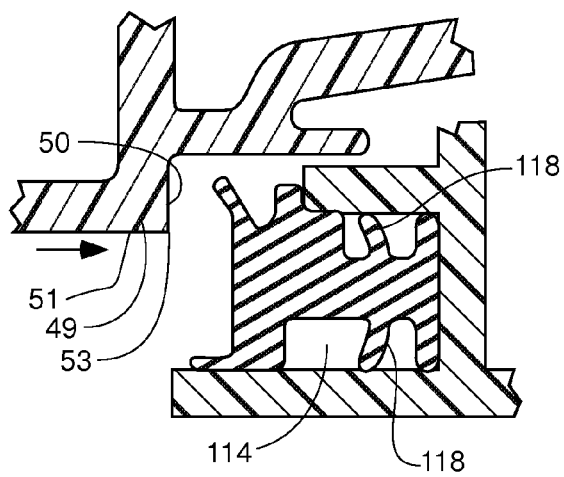

WAFER CONTAINER WITH DOOR INTERFACE SEAL

RELATED APPLICATIONS

This present application is a National Phase entry of PCT Application No. PCT/US2013/039768, filed May 6, 2013, which claims priority to U.S. Provisional Application No. 61/642,922, filed May 4, 2012, the disclosures of which are incorporated by reference in their entirety.

FIELD OF THE INVENTION

This application relates to containers and more particularly to wafer containers having front doors that sealingly attach.

BACKGROUND OF THE INVENTION

Semiconductor wafers are subjected to numerous steps during processing. This usually entails transporting a plurality of wafers between workstations or facilities for processing. Semiconductor wafers are delicate and easily damaged by physical contact or shock and by static electricity. Further semiconductor manufacturing processes are extremely sensitive to contamination by particulates or chemical substances. Consequently, in order to reduce the deleterious effect of contaminants on wafers, specialized containers have been developed to minimize the generation of contaminants and to isolate wafers from contaminants exterior to the containers. These containers typically include a removable door with gasketing or other means for providing a tight seal of the door with the container body.

As semiconductors have become smaller in scale, that is, as the number of circuits per unit area has increased, contaminants in the form of particulates have become more of an issue than previously. The size of particulates that can destroy a circuit has decreased and is approaching the molecular level. Consequently, ever better particulate control is desirable during all phases of manufacturing, processing, transporting, and storage of semiconductor wafers.

Wafer carriers are typically made from thermoplastic materials. Early containers, for example the container disclosed in U.S. Pat. No. 4,248,346, were made of highly moldable plastics such as polyethylene. Later containers, such as disclosed in U.S. Pat. No. 5,273,159, held rigid h-bar carriers, and are often made from polycarbonate with molded in slots and with softer, more resilient, covers such as disclosed in U.S. Pat. No. 5,586,658, for example. Each of U.S. Pat. Nos. 4,248,346; 5,273,159; and 5,586,658 are hereby fully incorporated herein by reference.

Some of the prior containers have a door to container portion seal and also have the capability to sealingly engage to process equipment. Such containers have been termed "SMIF pods" (Standard Mechanical Interface) where the door closes an open bottom of the container portion, or FOUPs (Front Opening Unified Pods) and FOSBs (Front Opening Shipping Box) where the door closes an open front. These containers are subjected to very demanding structural requirements and performance requirements. For example, they must be mechanically sealably latchable by both robotic and manual means and must be hermetically sealable simply by closing and latching the door in place on the container.

Conventional seals for both SMIF pods and transport modules have typically been relatively simple elastomeric seals that are simply compressed between the door and container portion in an axial direction to provide the seal. Such seals, particularly where polycarbonate material is contacted by the elastomeric seal, tend to stick excessively and provide inconsistent opening, reduced life expectancy of the seal and inadequate sealing. It has been a problem that during robotic opening of the doors the seals stick to the door frame and pull out of the retaining groove where they were seated in the door. Additionally, leakage both between the seal and the door frame, and between the seal and the retaining groove on the door has been more than desirable.

Moreover, known seals have been problematic during washing of wafer containers. They either need to be removed prior to washing or they may retain water trapped between seal and retaining groove. Such trapped water is a contaminant during wafer processing operations and is not acceptable.

What is needed in the industry is a better performing and longer lasting seal structure for sealing a door with the enclosure of a wafer container and that may remain in place during washing operations and does not disengage from the retaining groove during normal operation.

SUMMARY OF THE INVENTION

The present invention addresses the need of the industry for a better performing and longer lasting seal structure for a wafer container by providing an elastomeric seal that has enhanced sealing capabilities with respect separating the interior and exterior of the container, enhanced retention of the seal in the groove characteristics, and enhanced sealing of the groove by the seal to preclude leakage through the seal-groove engagement and to minimize or eliminate water from entering the groove during washing.

In accordance with the invention, a wafer container includes a container portion with a door frame defining an opening for insertion and removal of wafers in an axial direction and a door insertable into, in an axial direction, and fittable within, the door frame to close the open front and seal the container portion. In an embodiment of the invention, a continuous elastomeric seal extends around the door inward of the periphery. The seal is positioned in a retaining groove extending in an axial direction proximate the perimeter of the door.

A feature and advantage of embodiments of the invention is that a plurality of lateral projections extend from each side, the inner side and the outer side, of a central core portion for engaging the opposing sides of the groove, the inward side and the outward side. It is understood that the features described and claimed herein are typically referencing the features such as they appear in the cross sectional views, it is apparent that the features extend continuously around the continuous seal. For example, a thin projection from a core portion that extends all the way around seal may be described and claimed as a "finger" referencing its appearance on the cross sectional views. The core with the projections, as compared to a singular body portion with no projections, is easily inserted into the groove as the lateral projections, a pedestal and the tangs, may readily deflect and compress to reduce the effective width of the seal during insertion and then resist removal of the seal, particularly by the tangs which may be slightly upwardly angled. Removal requires the tangs to compress and then invert to a slightly downward angle for removal which requires more force than the insertion force. Moreover, the first and second projections provide lateral sealing to preclude or minimize water from entering the groove during washing. This allows washing of the door without removal of the seal providing an advantage over conventional, particularly radially installed seals.

Alternatively, the frame can be dimensioned such that when the door is seated, the bridging portion of the elastomeric seal is compressed interstitially between the sealing surface of the door and the sealing surface of the door frame.

A feature and advantage of the invention is ease of installation and removal. The install is a simple press fit "axial" install and does not involve deforming the gasket as is necessary in a "radial" install.

A feature and advantage of the invention is that the non-symmetrical design provides a fail-safe installation as there is only one way that the seal will fit the groove.

A feature and advantage of the invention is that enhanced sealing is provided without excessive closing pressures. A C-shaped portion is at the top of the seal and provides effective sealing with minimal compressive force. The upper leg of the C sealingly engaging the door frame and the lower leg engaged with a shoulder of a wall defining the seal groove.

BRIEF DESCRIPTION OF THE DRAWINGS

FIG. 3 is a cross sectional view of the installation of a seal in accord with the invention.

FIG. 4 is a cross sectional view of the install as commenced in FIG. 3 with the seal seated in the seal retaining groove.

FIG. 5 is a cross sectional detail view of the seal on the door and the door frame before insertion and seating of the door in the door frame.

FIG. 6 is a cross sectional detail view of the door and door frame of FIG. 5 in a fully seated position corresponding to the door latched onto the container portion.

FIG. 8 is the seal on the door and the door frame in a further embodiment with an enhancement for improved water repulsion during cleaning.

FIG. 9 is a cross sectional detail view of a further embodiment of an invention herein.

DETAILED DESCRIPTION

Figure 1:
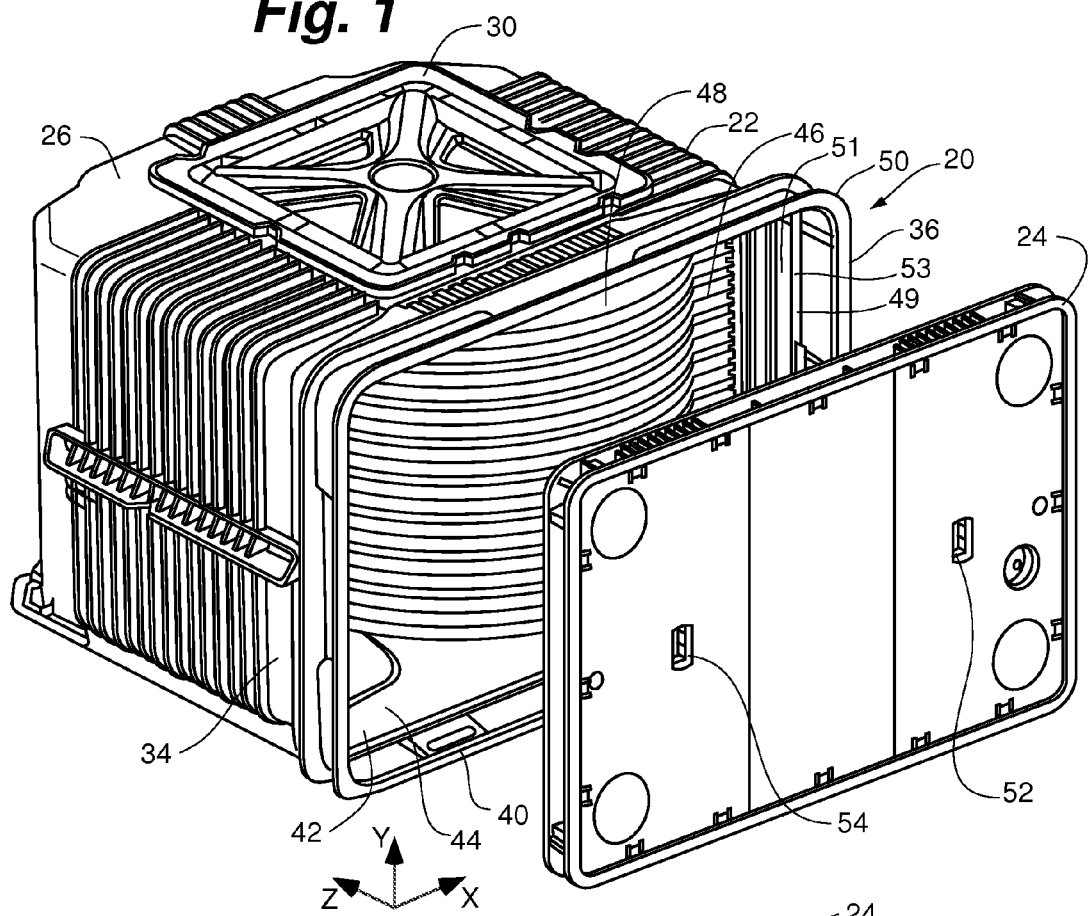
FIG. 1 is a perspective view of a wafer container in accord with the invention.
Figure 2:
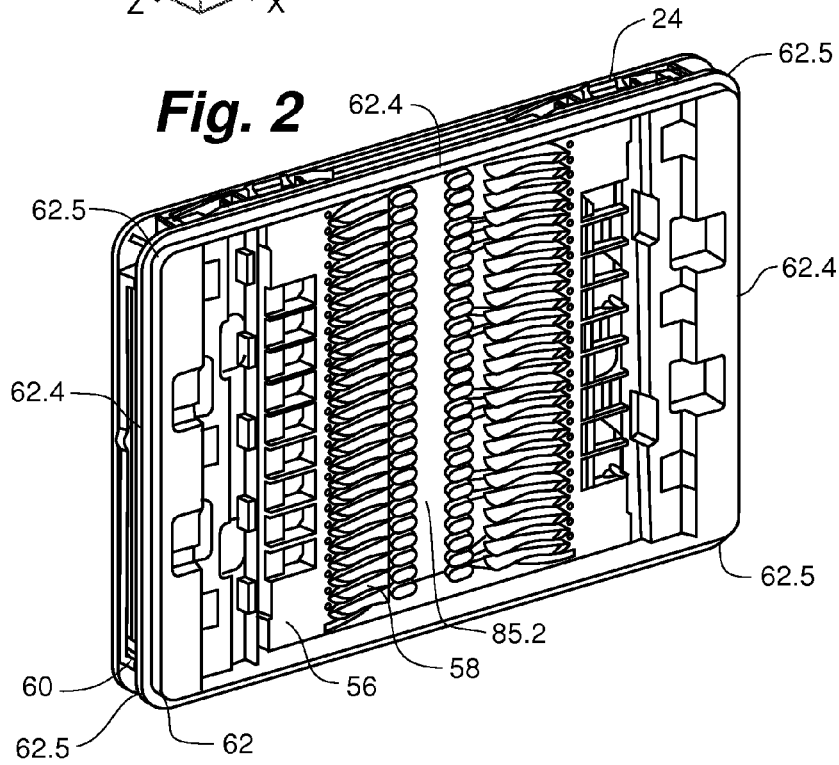
FIG. 2 is a perspective view of the door of the wafer container of FIG. 1 showing the inside facing surface of the door and the seal.
Figure 7:
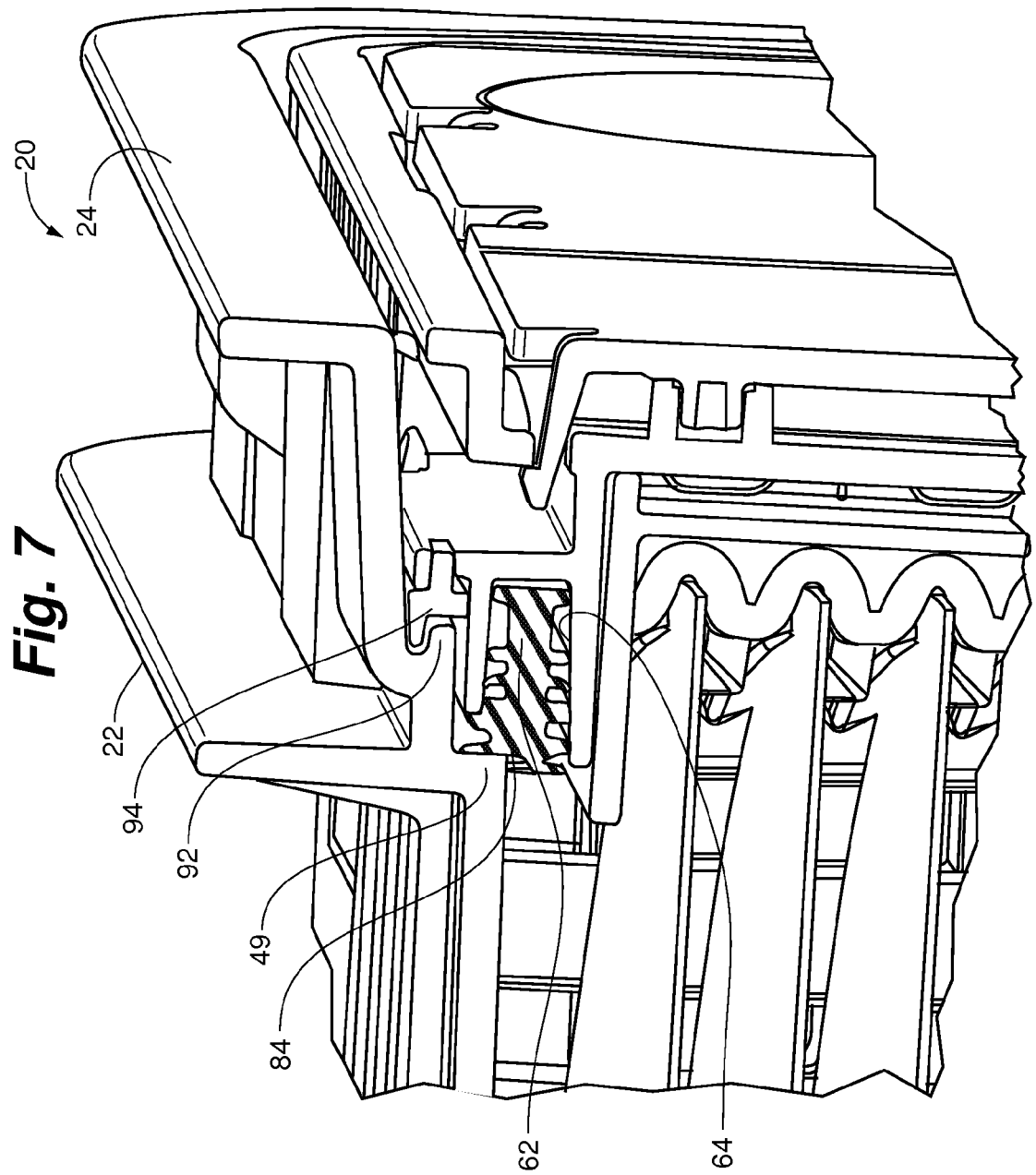
FIG. 7 is a detailed cross sectional perspective view illustrating the door fully engaged in the container portion with the seal in the door engaged with the container portion.

Referring to FIGS. 1, 2, and 7, a sealable container for holding a plurality of wafers is illustrated. The wafer container 20, generally comprises a container portion 22, and a door 24. The container portion having a top 26 with a robotic flange 30, a bottom 32 with a three groove kinematic coupling (not shown), a left side 34, a right side 36, and a door frame 40 and a defining a door opening 42 leading to an open interior 44 with wafer shelves 46 supporting wafers 48. The container portion having a seal engaging portion configured as a sealing corner portion 49 with a forward facing planar surface 50, an inwardly facing planar surface 51 and a corner 53.

Referring to FIGS. 2-7, the door 24 has a pair of latch mechanisms 52 with key holes 54, an inside surface 56 with wafer cushions 58, a periphery 60 and a seal 62 retained in a seal receiving groove 64. The seal receiving groove extending inwardly into the door adjacent the door periphery. The groove facing the interior of the container portion when the door is fitted in the door frame. The groove is generally configured as a channel with a bottom seating surface 68, two opposing side surfaces 70, 72, and an upper ledge portion 73 or shoulder and an upper ledge or shoulder surface 74. The groove is defined by an inward wall 65 and an outer wall 66. The outer wall has an outer wall surface 67.1 that confronts the inwardly facing surface 67.2 of the door frame. The inward wall surface 72 and outer wall surface 70 taper towards the bottom 68 of the groove. The upper ledge portion adjoining one of the two opposing sides at a corner 76.

Continuing to referring to FIGS. 2-9, the elastomeric seal 62 is disposed on the interior side of the door around and inward of the door periphery. The seal has four side segment portions 62.3, four corner portions 62.5. The seal is sized to be retained in the groove, the elastomeric seal in cross section having a central core portion 80 with a core inward side 80.6 and a core outwardly side 80.7. The central core portion having a base portion 80.8 and a base portion surface 80.9 and the core extends from the bottom 82 of the seal to the top 84 of the seal. The seal having a plurality of lateral projections 85. Lateral projections extend either outwardly toward the door frame and exterior of the container, or inwardly toward the center 85.2 of the door. The projections defining a bottom pedestal portion 86 positioned at the bottom of the central core portion, a pair of opposing tangs 90. The tangs sized with respect to the groove to be deflected upwardly when the seal is inserted into the groove as shown in FIG. 4, whereby the tangs compressively grip the side walls and provide a resistive force opposing removal of the seal from the groove. First and a second laterally protruding upper groove engaging projections 92, 94, the first groove engaging projection 92 engaging a side surface 72 of the groove and the second groove engaging portion having a notch portion 98 and engaging the opposing side surface 70 of the groove and the shoulder or upper ledge 73 at said notch portion. The first groove engaging projection and the second groove engaging portion, and the central core positioned intermediate the first and second groove engaging portions being laterally compressed between the two opposing side surfaces of the groove. The seal further comprising a cantilevered finger member 100 extending obliquely and laterally from the central core portion and positioned above the upper ledge portion. The fingers and protrusions extend from the core portion 80, generally the dotted lines of FIG. 5 illustrate a suitable boundary of the core portion.

Referring to FIGS. 5, 6, and 7, when the door is received in the door frame closing the open front of the container portion, the corner sealing portion engages the finger member extending obliquely to deflect said finger member downwardly and further engages the top 84 of the seal at the core portion 80. This compresses the C-shaped portion 81. The seal has a central axis a that extends through the length of the seal core as illustrated in the cross section. The axis divides the seal into an outward portion 112 and an inward portion 113. Notably when the seal engages the door frame only the outer portion is compressed by the door frame causing a rotational force to the upper portion 115 of the seal that forces the seal onto the shoulder 73 enhancing the seal between the seal and the door, as well as collapsing the C-shape portion by deflecting the upper leg of the C, and compressing core portion. The seal has six defined sealing engagement regions between the seal features and the surface 116 defining the groove.

Referring to FIG. 8, a further finger that has a normal position 110, in the deflected position lays along the inward wall and provides enhanced protection against water intrusion in the seal cavity 114 during cleaning.

Referring to FIG. 9, this embodiment has five distinct and separate sealing portions with the groove surface and the tangs 118 that resist removal of the seal.

The container portion components can be formed of injection molded polymers, for example polycarbonate. The seal is formed of a thermoplastic elastomer which may have a Shore A hardness of 30-60 durometer.

The above references in all sections of this application are herein incorporated by references in their entirety for all purposes.

All of the features disclosed in this specification (including the references incorporated by reference, including any accompanying claims, abstract and drawings), and/or all of the steps of any method or process so disclosed, may be combined in any combination, except combinations where at least some of such features and/or steps are mutually exclusive.

Each feature disclosed in this specification (including references incorporated by reference, any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment (s). The invention extends to any novel one, or any novel combination, of the features disclosed in this specification (including any incorporated by reference references, any accompanying claims, abstract and drawings), or to any novel one, or any novel combination, of the steps of any method or process so disclosed The above references in all sections of this application are herein incorporated by references in their entirety for all purposes.

Although specific examples have been illustrated and described herein, it will be appreciated by those of ordinary skill in the art that any arrangement calculated to achieve the same purpose could be substituted for the specific examples shown. This application is intended to cover adaptations or variations of the present subject matter. Therefore, it is intended that the invention be defined by the attached claims and their legal equivalents, as well as the following illustrative aspects. The above described aspects embodiments of the invention are merely descriptive of its principles and are not to be considered limiting. Further modifications of the invention herein disclosed will occur to those skilled in the respective arts and all such modifications are deemed to be within the scope of the invention.

The invention claimed is:

1. A substrate container having a container portion with a door frame defining an open side and a door to latch to the door frame and close the open side, the door having a groove with a pair of sidewalls extending around a periphery of the door with a seal installed in said groove, the seal engageable with the door frame for sealing the door to the container portion, the seal having a pedestal portion seated in a bottom of the groove, the pedestal portion engaging each of the sidewalls, a core portion extending from the pedestal to a top of the seal, a plurality of opposing pairs of projections for engaging opposing sidewalls of the groove extending from the core portion, at least one pair sized to be larger than the groove at a position corresponding to the at least one pair of projections whereby the projections are angled upwardly and inhibit removal of the seal from the groove, another pair of projections extend directly laterally outwardly engaging the sidewalls, and positioned above the pair of projections that are angled upwardly, wherein the groove is defined by an inward wall and an outward wall, and wherein the outward wall has a shoulder portion below the top of the seal and wherein the seal has a lateral projection that engages the surface of the shoulder portion and an obliquely extending projection positioned above the lateral projection, said lateral projection and said obliquely extending projection being part of a C-Shaped portion, wherein the obliquely extending projection is deflected toward the lateral projection when the door is placed in the doorframe.

2. The front opening wafer container of claim 1 wherein the opposing projections are configured to require compression and an inversion to a deflection in a direction toward the install direction in order to remove the seal from the groove.

3. The front opening wafer container of claim 1 wherein the groove has side wall surfaces that are tapered toward said bottom.

4. A front opening wafer container for holding large diameter wafers of at least 300 mm, the wafer container comprising a container portion with an open front defined by a door frame, a door for sealing latching to the container portion in the door frame, the door having a groove for receiving a seal extending around a periphery of the door with a seal therein, the seal having at least three pairs of opposing lateral projections and at least five distinct and separate regions of contact with the door, wherein the groove is defined by an inward wall and an outward wall, and wherein the outward wall has a shoulder portion below the top of the seal and wherein the at least three pairs of opposing lateral projections includes a lateral projection that engages the surface of the shoulder portion, and the seal further comprises an obliquely extending projection positioned above the lateral projection that engages the surface of the shoulder portion, said lateral projection and said obliquely extending projection being part of a C-Shaped portion, wherein the obliquely extending projection is deflected toward the lateral projection when the door is placed in the doorframe.

5. The front opening wafer container of claim 4 wherein at least one pair of the three pairs of opposing lateral projections is configured as tangs that releasable lock the seal in place when inserted in the groove.

6. The front opening container of claim 4 wherein the seal receiving groove faces the container portion as the door is being inserted into the door frame.

7. The front opening container of claim 4 wherein the seal has a C-shaped portion that is compressed when the door is sealingly engaged and latched to the container portion, the C-shaped portion positioned opposite a wall with which the seal is engaged.

8. The front opening container of claim 4 wherein the groove is defined by an inward wall and an outward wall, and wherein the outward wall has a shoulder portion below the top of the seal and wherein the seal has a lateral projection that engages the surface of the shoulder portion, said lateral projection being part of a C-Shaped portion.

9. The front opening wafer container of claim 4 wherein there are seven distinct and separate sealing engagements between the seal and the surface defining the groove.

10. A sealable container for holding a plurality of wafers, the container comprising:

a container portion having a top, a bottom, a left side, and a right side defining an interior space for receiving the wafers, the container portion having opposing shelves in the interior adjacent the left and right sides, the container portion having a kinematic coupling positioned at the bottom of the container portion, the container portion having an open side defined by a door frame, the door frame adjoining the top, the bottom, the left side and the right side and presenting a frame periphery with a corner sealing portion, the corner sealing portion comprising a forward facing planar surface and an inwardly facing surface extending rearwardly from the forward facing planar surface and defining a corner;

a door receivable in the door frame to sealingly close the open side of the container portion, the door having an interior side and presenting a door periphery with a groove extending inwardly into the door adjacent the door periphery, the groove facing the interior of the container portion when the door is fitted in the door frame, wherein the groove is configured as a channel and is defined by a bottom seating surface, two opposing side surfaces, and an upper ledge portion with the upper ledge portion adjoining one of the two opposing sides at a corner; and an elastomeric seal disposed on the interior side of the door around and inward of the door periphery, the seal sized to be retained in the groove, the elastomeric seal in cross section having a central core portion, the central core portion extending from the bottom of the seal to the top of the seal, the seal having a bottom pedestal portion positioned at the bottom of the central core portion, a pair of opposing tangs protruding laterally outwardly from the central core portion, the tangs sized with respect to the groove to be deflected upwardly when the seal is inserted into the groove whereby the tangs compressively grip the side walls and provide a resistive force opposing removal of the seal from the groove, a first and a second laterally protruding upper groove engaging projections, the first groove engaging projection engaging a side surface of the groove and the second groove engaging portion having a notch portion and engaging the opposing side surface of the groove and the upper ledge at said notch portion, the first groove engaging projection, the second groove engaging portion, and the central core positioned intermediate the first and second groove engaging portions being laterally compressed between the two opposing side surfaces of the groove, the seal further comprising a finger member extending obliquely and laterally from the central core portion and positioned above the upper ledge;

wherein when the door is received in the door frame closing the open front of the container portion, the corner sealing portion engages the finger member extending obliquely to deflect said finger member downwardly and further engages the top of the seal at the core portion.

11. The seal of claim 10 wherein the finger member extending obliquely is part of a C-shaped portion.

12. The seal of claim 10, wherein an inward side of the core has three inwardly extending projections, including the pedestal portion.

13. The seal of claim 10, wherein an inward side of the core has four inwardly extending projections, including the pedestal portion and a tang portion.

14. The seal of claim 10 wherein the central core portion thickens in a direction opposite the install direction.

15. The seal of claim 10 wherein the core portion from which the lateral projections extend thickens in a direction opposite the install direction.

\* \* \* \* \*